United States Patent
Okamoto et al.

(10) Patent No.: US 6,653,671 B1
(45) Date of Patent: Nov. 25, 2003

(54) SEMICONDUCTOR DEVICE

(75) Inventors: Kazuyoshi Okamoto, Tokyo (JP); Hirohiko Wakasugi, Tokyo (JP)

(73) Assignee: Mitsubishi Denki Kabushki Kaisha, Tokyo (JP)

( * ) Notice: Subject to any disclaimer, the term of this patent is extended or adjusted under 35 U.S.C. 154(b) by 0 days.

(21) Appl. No.: 10/301,633

(22) Filed: Nov. 22, 2002

(30) Foreign Application Priority Data

May 31, 2002 (JP) ....................................... 2002-160404

(51) Int. Cl.⁷ ............................................... H01C 31/00
(52) U.S. Cl. ...................... 257/202; 257/691; 257/692
(58) Field of Search ................... 257/443, 691, 257/692

(56) References Cited

U.S. PATENT DOCUMENTS 4,779,108 A * 10/1988 Inoue
6,228,196 B1 * 5/2001 Sakamoto et al.

FOREIGN PATENT DOCUMENTS

JP  2000-340568  12/2000

* cited by examiner

*Primary Examiner*—Fetsum Abraham
(74) *Attorney, Agent, or Firm*—Burns, Doane, Swecker & Mathis, LLP

(57) ABSTRACT

A semiconductor device has a dummy pattern including an underlying layer which is formed on a semiconductor substrate and in which a plurality of word lines from N−2 to N+2 are arranged in parallel, a plurality of blocks each of which has a plurality of dummy sheets arranged in such a way that each of them spreads over the two word lines neighboring in the direction along the word lines from N−2 to N+2, and a plurality of dummy sheets arranged between the plurality of blocks in such a way that each of them spreads over the two word lines neighboring between the blocks.

7 Claims, 2 Drawing Sheets

SEMICONDUCTOR DEVICE

BACKGROUND OF THE INVENTION

1. Field of the Invention

The present invention relates to a semiconductor device such as a semiconductor memory device and, in particular, to a semiconductor device in which the arrangement of dummy sheets formed on a substrate is improved to planarize the surface of the substrate by a CMP (chemical mechanical polishing).

2. Description of the Related Art

In recent years, in response to the need for a higher-density semiconductor integrated circuit, progress has been made in increasing the number of layers of a multilayer semiconductor device. This increasing the number of layers of a multilayer semiconductor device tends to accumulate and increase roughness (bumps and dips) on the surface of the semiconductor substrate. Such bumps and dips on the surface of the substrate make it difficult to obtain correct focus in an exposure process and thus become one factor in causing defects in a fine pattern lithography. One of technologies solving this problem is the chemical mechanical polishing (hereinafter referred to as "CMP") which becomes indispensable to a most advanced semiconductor manufacturing process.

However, planarizing the substrate by the CMP is substantially affected by the difference in the arrangement density of metal conductive layers such as a wiring and the like formed on the underlying layer of an insulating layer to be polished. In other words, load applied to the respective metal conductive layers when the substrate is planarized by the CMP becomes larger in the region of the underlying layer where the arrangement density of the metal conductive layers is low than in the region where the arrangement density is high. For this reason, in the insulating layer corresponding to the underlying layer where the arrangement density of the metal conductive layers is low, a polishing rate becomes larger. This causes bumps and dips on the surface of the semiconductor substrate even after the CMP is applied to the surface.

Such existence of bumps and dips affect the manufacturing conditions of the following processes. For example, in the case where through holes are made in the substrate after the substrate is subjected to the CMP, the through holes are made in different depths in accordance with the bumps and dips. This causes metal in the through hole to enter a portion not intended, for example, to cause a defect of producing a leak current. Therefore, it is necessary to put a dummy pattern previously at a mask designing step for a region where the arrangement density of the metal conductive layer on the semiconductor substrate is low.

FIG. 5 is a plan view to show an example of the arrangement of dummy sheets provided when the memory array part of a semiconductor memory device is formed. In FIG. 5, a reference numeral 100 denotes a semiconductor substrate constituting a memory array part in which memory cells and a plurality of word lines and a plurality of bit lines of their signal lines are formed in a matrix. A reference numeral 101 denotes a dummy sheet and the dummy sheets 101 are arranged in an array irrespective of the arrangement layout of the memory cells on the substrate 100 that is an underlying layer. Moreover, for the memory array part of the semiconductor memory device, in general, rectangular dummy sheets 101 are used as the simplest dummy pattern.

As shown in FIG. 5, arranging the dummy sheets 101 in an array on the substrate 100 can relax the effect produced by the difference in the arrangement density of the memory cells, the word lines, and the bit lines formed on the underlying layer, and thus can reduce the dumps and dips formed on the surface of the substrate after the substrate is subjected to the CMP. Moreover, as the semiconductor manufacturing process progresses, the case has increased in number where the dummy sheet becomes larger in size than the memory cell. For this reason, there is also the case where the plurality of dummy sheets 101 are arranged close to each other such that each of them spreads over two neighboring word lines.

Since the semiconductor device in the prior art is constituted in the manner described above, it presents a problem that the capacitive coupling of the dummy sheets provided for the CMP and the wirings of the underlying layer might cause a defect in the operation.

For example, when it is supposed that a case where a plurality of dummy sheets 101 are arranged in the direction of row in such a way that each of them spreads over two neighboring word lines in the semiconductor memory device shown in FIG. 5. In this example of arrangement, a plurality of blocks each of which includes a group of dummy sheets 101 arranged in such a way that each of them spreads over two neighboring word lines are arranged along the direction of column. When an electric signal is propagated in the word line in the semiconductor memory device having such a configuration, in the respective blocks described above, the dummy sheets 101 are capacitively coupled to the word lines in various degrees.

For example, in the case where the dummy sheet is large in size and two neighboring blocks are different from each other in coupling capacity, an electric interference might be produced between the word lines via the dummy sheet 101. The electric interference caused by variations in coupling capacity between the dummy sheet 101 and the word line may produce a serious effect on the operation of the semiconductor memory device.

Further, analyzing the defects of the semiconductor device becomes an effective countermeasure for an improvement of yield that is always a problem in manufacturing the semiconductor device. In particular, a physical arrangement information of the constituent part that is found to be defective becomes an important parameter in the analysis of the defect. In the semiconductor device in the prior art, however, the dummy sheets for the CMP are arranged uniformly without reference to the layout of the constituent parts of the underlying layer.

For this reason, it is difficult to discriminate from outward appearances which constituent part is arranged in the underlying layer of the dummy sheets, which presents the problem that it is difficult to obtain the physical arrangement information of the constituent part which is found to be defective.

SUMMARY OF THE INVENTION

The present invention has been made to solve the problems described above. It is an object of the present invention to provide a semiconductor device capable of reducing the electric interference between wirings on an underlying layer via dummy sheets arranged for the CMP.

Moreover, it is another object of the present invention to provide a semiconductor device capable of easily obtaining the physical arrangement information of constituent parts provided on the underlying layer of dummy sheets.

A semiconductor device in accordance with the present invention includes a wiring layer which is formed on a semiconductor substrate and in which a plurality of wirings are arranged in parallel, and a dummy pattern including a plurality of blocks each of which has a plurality of dummy sheets arranged in such a way that each of them spreads over two wirings neighboring in the direction along the wiring and a plurality of dummy sheets arranged between the plurality of blocks in such a way that each of them spreads over two wirings neighboring between the blocks.

Moreover, a semiconductor device in accordance with the present invention includes a wiring layer which is formed on a semiconductor substrate and in which a plurality of wirings are arranged in parallel, the first layer in which a plurality of dummy sheets are arranged on the wirings in the direction along the wiring, the second layer in which the dummy sheets are arranged in such a way that each of them spreads over two neighboring dummy sheets arranged on the first layer, and an electric connection parts for electrically connecting the dummy sheets arranged on the first layer to the dummy sheets arranged on the second layer, respectively.

Therefore, according to the present invention, all the wirings can be capacitively coupled to each other via the dummy sheets and their coupling capacities can be made nearly equal to each other as a whole. This can produce an effect of reducing electric interference caused by the capacitive coupling between the wirings via the dummy sheets.

DETAILED DESCRIPTION OF THE PREFERRED EMBODIMENTS

Hereinafter the preferred embodiments of the present invention will be described.

EMBODIMENT 1

Figure 1:
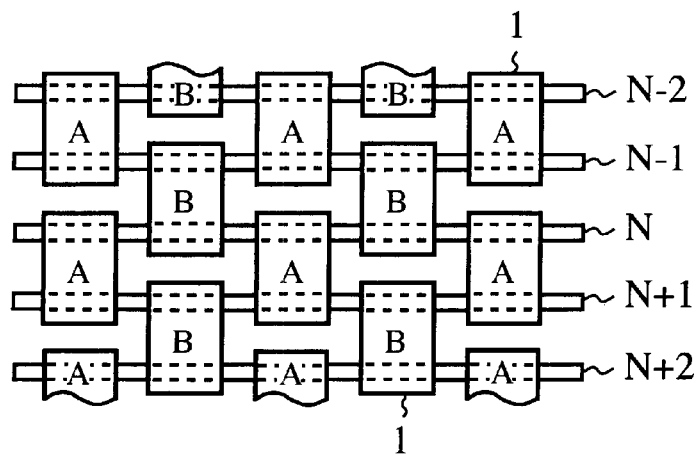
FIG. 1 is a plan view to show an example of the arrangement of dummy sheets for CMP provided on a semiconductor device in accordance with an embodiment 1 of the present invention.

FIG. 1 is a plan view to show an example of the arrangement of dummy sheets for CMP provided on a semiconductor device in accordance with an embodiment 1 of the present invention. In FIG. 1, a ROM is taken as an example of the semiconductor device and an example of the arrangement of dummy sheets provided when its memory array part is formed will be shown. In the ROM, in general, with respect to memory cells arranged in a matrix, one word line is arranged in correspondence with one row of memory cells. Further, one bit line is arranged in correspondence with one column of memory cells. Even in the present embodiment, about a ROM having such a configuration the description will be given.

In FIG. 1, a reference numeral 1 denotes a dummy sheet for lessening a difference in the arrangement density of constituent parts such as word lines formed on an underlying layer (wiring layer), and the dummy sheet has a rectangular shape and it is larger in size than the memory cell and is arranged in such a way as to spread over two neighboring word lines. The reference symbols for lines from N−2 to N+2 denote the word lines (wirings) constituting a memory array and are arranged at equal intervals in the direction of column, respectively.

As shown in FIG. 1, the semiconductor device in accordance with the present embodiment has block each of which includes a group of dummy sheets A in which a plurality of dummy sheets 1 denoted by a reference symbol A are arranged in the direction along the respective word lines from N−2 to N+2 (hereinafter referred to as the direction of row) in such a way that each dummy sheet 1 spreads over two neighboring word lines. Moreover, there are provided groups of dummy sheets B in which a plurality of dummy sheets 1 denoted by a reference symbol B are arranged in the direction perpendicular to the respective word lines from N−2 to N+2 (hereinafter referred to as the direction of column) in such a way that each dummy sheet 1 spreads over two neighboring word lines between the blocks. In this manner, a dummy pattern is formed by the blocks each of which includes the group of dummy sheets A and the groups of dummy sheets B.

In FIG. 1 are shown two columns of groups of dummy sheets B, but to produce the effect of the present invention, it is essential only that at lest one column of group of dummy sheets B are provided.

Here, for example, paying attention to a word line N, the word line N is capacitively coupled to the word line N+1 by the dummy sheet A and is capacitively coupled to the word line N−1 by the dummy sheet B. Moreover, the word line N−1 is capacitively coupled to the word line N−2 by the dummy sheet A and is capacitively coupled to the word line N−3 (not shown) arranged next to the word line N−2 by the dummy sheet B provided on the word line N−2. Similarly, the word line N+1 is capacitively coupled to the word line N+2 by the dummy sheet B and is capacitively coupled to the word line N+3 (not shown) arranged next to the word line N+2 by the dummy sheet A provided on the word line N+2.

As described above, according to the present embodiment 1, the dummy pattern is constructed of blocks each including the group of dummy sheets A in which the plurality of dummy sheets A are arranged in the direction of row in such a way that each dummy sheet A spreads over two neighboring word lines and the groups of dummy sheets B in which the plurality of dummy sheets B are arranged in the direction of column in such a way that each dummy sheet B spreads over two word lines neighboring between the blocks. As a result, all the word lines are capacitively coupled to each other and thus their coupling capacities can be made nearly equal to each other as a whole. Thus, this can reduce electric interference caused by the capacitive coupling between the word lines of the underlying layer via the dummy sheets 1.

Incidentally, in the forgoing embodiment 1 has been shown an example in which the group of dummy sheets B are arranged every column, but it is not intended to limit the present invention to this embodiment 1. For example, even the group of dummy sheets B arranged every two or three columns can also produce the same effect as a whole, depending on the relative relationship between the dummy sheet 1 and the memory cell such as the size of the dummy sheet 1 and distance between the dummy sheet 1 and the memory cell, and to produce the effect of the present invention, it is essential only that at least one column of group of dummy sheets B are provided.

Moreover, in the forgoing embodiment 1 has been described the example of the word line of the ROM, but needless to say, the present invention can be applied to an SRAM, a DRAM, EEPROM and so on other than the ROM, in which word lines are arranged at equal intervals.

In addition, in the foregoing embodiment 1 has been described the word lines arranged at equal intervals, but a case also can be thought where the word lines are arranged at different intervals because of an relation to the arrangement space between the peripheral circuit and them. Even in such a case, if the respective dummy sheets B constituting the group of dummy sheets B are shifted in the direction of column, they can be arranged in such a way that each of them spreads over two word lines neighboring between the blocks.

For example, a case is assumed that a block including the group of dummy sheets A in which the dummy sheets A are arranged in such a way that each of them spreads over the word line N and the word line N+1, is a block 1 and that a block including the group of dummy sheets A in which the dummy sheets A are arranged in such a way that each of them spreads over the word line N−1 and the word line N−2, is a block 2. Here, let's take a case where the gap between the word lines included in the same block is different from the gap between the word line N and the word line N−1 constituting a different block.

Even in such a configuration, if the dummy sheets B are shifted by a distance of half the gap between the word lines in the block in the direction of column from the dummy sheets A, as is the case with the embodiment 1 described above, they can be arranged in such a way that each of them spreads over two word lines N, N−1 neighboring between the blocks 1, 2.

EMBODIMENT 2

Figure 2:
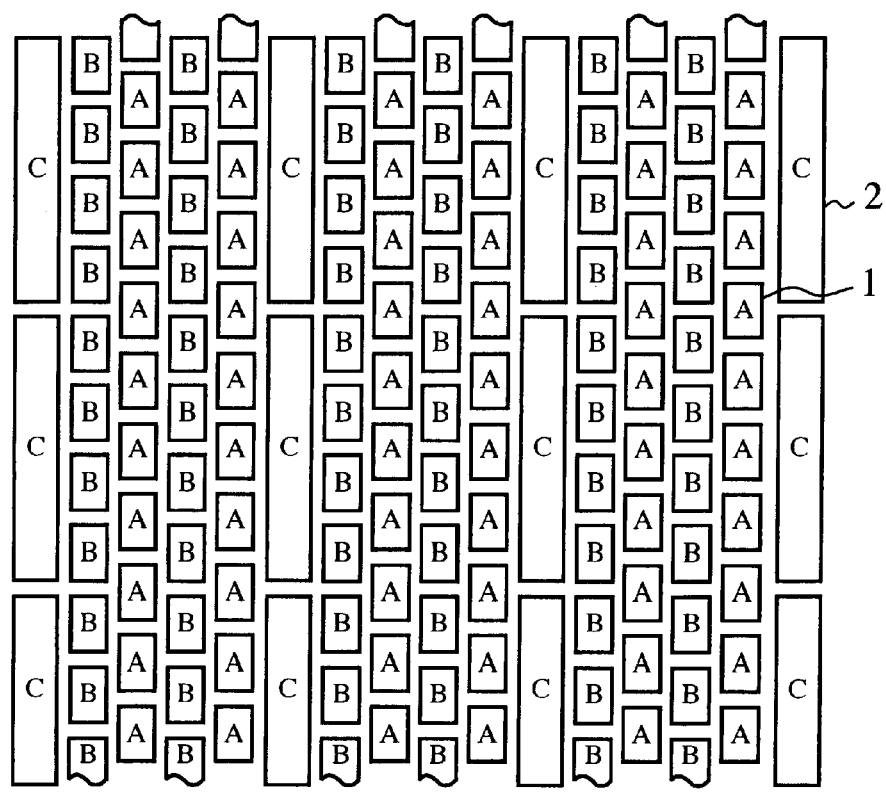
FIG. 2 is a plan view to show an example of the arrangement of dummy sheets for CMP provided on a semiconductor device in accordance with an embodiment 2 of the present invention.

FIG. 2 is a plan view to show an example of the arrangement of dummy sheets for the CMP provided on a semiconductor device in accordance with an embodiment 2 of the present invention. Even in this drawing, as is the case with the above-mentioned embodiment 1, a ROM is taken as the example of the semiconductor device and an example of the arrangement of dummy sheets provided when its memory array part is formed will be shown. In FIG. 2, a reference numeral 2 denotes a dummy sheet provided according to the specific constituent parts arranged on an underlying layer (wiring layer) and their positions, and the dummy sheet is shaped like a rectangle elongated in the direction of column, which is different from the dummy sheet 1. These dummy sheets 2 are arranged in the direction of row at intervals of memory cells corresponding to the appropriate number of bits constituted in the underlying layer. Moreover, it is thought that the dummy sheets 2 are inserted at appropriate separating positions in view of a layout, for example, are arranged at the portions where word lines are fixed. On the other hand, the dummy sheet 2 corresponds to four dummy sheets 1, that is, eight word lines. In FIG. 2, the dummy sheet 2 is denoted by a reference symbol C and the positional relationship between the dummy sheet 2 and the dummy sheet 1 in the dummy pattern is shown. Here, the same constituent elements as shown in FIG. 1 are denoted by the same reference numerals and their further descriptions will be omitted.

As described above, the dummy sheets for the CMP in the prior art are arranged uniformly on the whole surface of the substrate without reference to the arrangement of the constituent parts on the underlying layer. For this reason, in the analysis of a defective device, it is difficult to obtain the physical arrangement information of in what portion of the substrate a defective constituent part is. Thus, according to the present invention, dummy sheets are arranged in such a way that at least one of shape, size, and arrangement pattern is changed at an arrangement cycle specified in accordance with the arrangement positions of the constituent parts formed on the underlying layer (wiring layer). In particular, in the present embodiment 2, dummy sheets 2 having different shapes are arranged in the arrangement cycle specified in accordance with the arrangement positions of the memory cells provided on the underlying layer, that is, in the arrangement cycle corresponding to a predetermined bit.

In FIG. 2 are shown six columns of groups of dummy sheets B and four columns of dummy sheets 2, but to produce the effect of the present invention, it is essential only that at lest one column of dummy sheets B and at least one column of dummy sheets 2 are provided.

In such a manner, for example, in the case where a defect is found at a certain memory cell, it is possible to locate the position of the defective memory cell, that is, to determine the ordinal numbers of column and row on the substrate of a dummy sheet C in the vicinity of which the defective memory cell is positioned. Further, on the basis of the dummy sheet C, it is possible to determine the ordinal numbers of column and row of the dummy sheet A and the ordinal numbers of column and row of the dummy sheets B in the vicinity of which the defective memory cell is positioned.

As described above, according to the present embodiment 2, the dummy sheets C that are different in the shape from the dummy sheets A, B are arranged in accordance with the specific constituent parts arranged on the underlying layer and their positions, so that it is possible to easily obtain the physical arrangement information of the defective memory cell by using the dummy sheet C as a mark.

Further, in the foregoing embodiment 2 has been shown the example in which the dummy sheets having different shapes are arranged according to the specific constituent parts arranged on the underlying layer and their positions, but it is not intended to limit the present invention to the embodiment 2. For example, it is also recommended that the dummy sheets are shifted in arrangement to change the arrangement pattern according to the specific constituent parts arranged on the underlying layer and their positions without using the dummy sheets each having a different shape.

Still further, to clearly show the specific constituent parts arranged on the underlying layer and the partitions of their positions, it is also recommended that dummy sheets each having a shape other than the above-mentioned shape, are prepared and arranged in relation to the specific constituent parts and their positions.

EMBODIMENT 3

In the foregoing embodiments have been shown only the cases where the dummy sheets are arranged on one layer, but in the present embodiment 3 will be described a case where the dummy sheets are arranged on a plurality of layers.

An example of the arrangement of the dummy sheets in the case of the plurality of layers will be described.

First, the dummy pattern shown in the above embodiment 1 is provided as a lower layer. Next, dummy sheets are arranged as an upper layer in the same layout as on the lower layer. In this manner, as shown in the above embodiment 1, all the word lines are capacitively coupled to each other via the dummy sheets and thus their coupling capacities can be nearly equal to each other as a whole in the lower layer. On the other hand, since the dummy sheets are arranged also on the upper layer in the same layout, there is no electric interference between the constituent parts on the underlying layer.

In addition, another example of an arrangement of the dummy sheets in the case of the plurality of layers.

First, a dummy pattern shown in the above embodiment 1 is provided as the lower layer. Next, as the upper layer is provided a dummy pattern in which dummy sheets are shifted in the direction of column every one column by the gap between the word lines as compared with the lower layer. As shown in the above embodiment 1, if the capacity per one word line is taken, the capacity becomes uniform as a whole. Here, shifting the dummy sheets every two or more columns can also produce the same effect.

Incidentally, in the case where the plurality of layers are arranged above and below an electrically insulating layer in the above embodiment 3, there are provided through holes that electrically connect the dummy sheets arranged as the upper and lower layers, respectively. By this arrangement the electric stability of the respective dummy sheets can be improved.

EMBODIMENT 4

Figure 3:
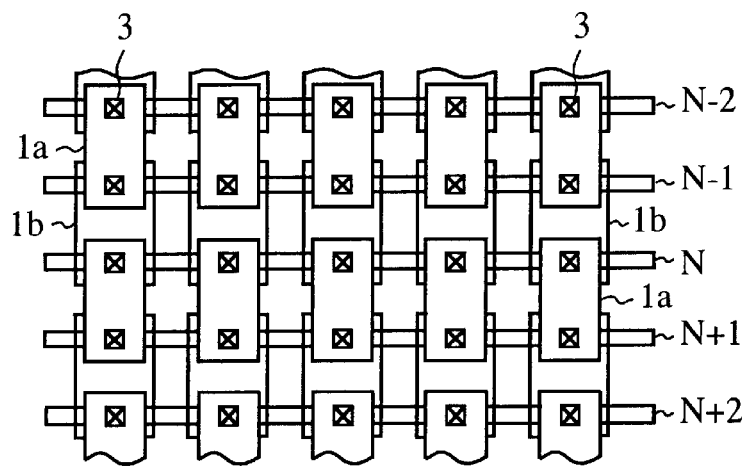
FIG. 3 is a plan view to show an example of the arrangement of dummy sheets for CMP provided on a semiconductor device in accordance with an embodiment 4 of the present invention.

FIG. 3 is a plan view to show an example of the arrangement of dummy sheets for the CMP provided on a semiconductor device in accordance with an embodiment 4 of the present invention. Also in FIG. 3, as is the case with the above embodiment 1, a ROM is taken as the example of the semiconductor device and an example of the arrangement of the dummy sheets provided when its memory array part is formed will be shown. In FIG. 3, reference symbols 1a, 1b denote dummy sheets and the dummy sheets 1a are arranged on the upper layer (the second layer) of a layer on which the dummy sheets 1b are arranged. A reference numeral 3 denotes a through hole (electric connection part) for electrically connecting the dummy sheet 1a to the dummy sheet 1b by a metal introduced into the hole made through the dummy sheet 1a. Here, the same constituent elements as shown in FIG. 1 are denoted by the same reference numerals and their further descriptions will be omitted.

As shown in FIG. 3, in the lower layer (the first layer), for example, a word line N is capacitively coupled to a word line N−1 by the dummy sheet 1b. Moreover, a word line N+1 is capacitively coupled to a word line N+2 by the dummy sheet 1b. A word line N−2 is capacitively coupled to a word line N−3 (not shown) arranged next to the word line N−2 by the dummy sheet 1b. Such an arrangement of dummy sheets, as is the case with the conventional arrangement, raises the possibility that the respective blocks might vary in coupling capacity.

Therefore, in the present embodiment 4, dummy sheets 1a are arranged on the upper layer (the second layer) of two dummy sheets 1b neighboring in the direction of column in such a way that each of the dummy sheet 1a spreads over the two dummy sheets 1b and each of the dummy sheets 1a is electrically connected to each of the dummy sheets 1b via the through hole 3. Also this configuration results in capacitively coupling all the word lines and can make their coupling capacities nearly equal to each other as a whole. This can reduce electric interference caused by the capacitive coupling between the word lines on the underlying layer via the dummy sheets.

In FIG. 3 are shown five columns of groups of dummy sheets 1b, but to produce the effect of the present invention, it is essential only that at least one column of group of dummy sheets 1b are provided.

In this respect, while the example using rectangular dummy sheets 1a, 1b has been shown in the above embodiment, dummy sheets having the other shapes may be used.

EMBODIMENT 5

Figure 4:
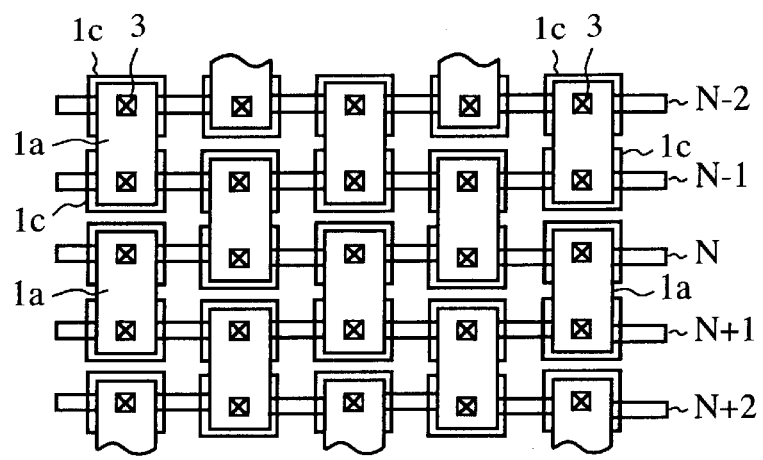
FIG. 4 is a plan view to show an example of the arrangement of dummy sheets for CMP provided on a semiconductor device in accordance with an embodiment 5 of the present invention.
Figure 5:
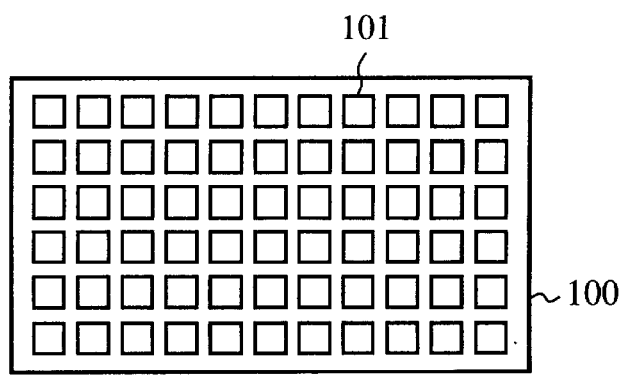
FIG. 5 is a plan view to show an example of the arrangement of dummy sheets for CMP provided when the memory array part of a semiconductor memory device is formed.

FIG. 4 is a plan view to show an example of the arrangement of dummy sheets for the CMP provided on a semiconductor device in accordance with an embodiment 5 of the present invention. Also in FIG. 4, as is the case with the above embodiment 1, a ROM is taken as the example of the semiconductor device and an example of the arrangement of the dummy sheets provided when its memory array part is formed will be shown. In FIG. 4, a reference symbol 1c denotes dummy sheets arranged over word lines from N−2 to N+2 respectively and the dummy sheets are provided on the respective memory cells. Further, it is essential only that each dummy sheet 1c has a space connected to an electric connection part such as a through hole 3 and a space in contact with a word line. As long as the dummy sheet 1c satisfies this condition, the dummy sheet 1c has no limitation as the minimum area. Here, the same constituent elements as shown in FIG. 3 are denoted by the same reference numerals and their further descriptions will be omitted.

As shown in FIG. 4, a plurality of dummy sheets 1c are arranged on a lower layer (the first layer) in the direction of row every respective word lines from N−2 to N+2. In this manner, the respective dummy sheets 1c can be capacitively coupled to the respective word lines from N−2 to N+2. There is the possibility, as is the case with the conventional arrangement, that this arrangement varies in the coupling capacity between the dummy sheet 1c and the word line, and thus causes electric interference between the word lines via the dummy sheet 1c.

Therefore, in the present embodiment 5, columns of dummy sheets 1a are arranged on the upper layer (the second layer) of the dummy sheets 1c on alternate columns of the dummy sheets 1c in such a way that each of dummy sheets 1a spreads over two dummy sheets 1c neighboring in the direction of column, and the dummy sheets 1a are electrically connected to the dummy sheets 1c by the through holes 3, respectively. Moreover, one column of dummy sheets 1a are arranged between two columns of dummy sheets 1a neighboring in the direction of column in the state where the dummy sheets 1a are shifted by the gap between the word lines, and the dummy sheets 1a are electrically connected to the dummy sheets 1c by the through holes 3, respectively.

Also this configuration results in capacitively coupling all the word lines and can make their coupling capacities nearly equal to each other as a whole. This can reduce electric interference caused by the capacitive coupling between the word lines on the underlying layer via the dummy sheets.

In FIG. 4 are shown three columns of groups of dummy sheets 1a each of which capacitively couples the word line N to the word line N+1, the word line N−2 to the word line N−1, or the like, but to produce the effect of the present invention, it is essential only that at least one column of group of dummy sheets 1a are provided.

Incidentally, while the semiconductor memory device such as the ROM has been described as the example of the semiconductor device in the above embodiments from 1 to 5, it is not intended to limit the present invention to these embodiments. In other words, the configuration of the present invention can be applied to a semiconductor device having a wiring layer in which a plurality of wirings are arranged in parallel on a semiconductor substrate.

What is claimed is:

1. A semiconductor device comprising:
    a wiring layer which is formed on a semiconductor substrate and in which a plurality of wirings are arranged in parallel; and
    a dummy pattern including a plurality of blocks each of which has a plurality of dummy sheets arranged in such a way that each of them spreads over two wirings neighboring in the direction along the wiring and a plurality of dummy sheets arranged between the plurality of blocks in such a way that each of them spreads over two wirings neighboring between the blocks.

2. The semiconductor device as claimed in claim 1, wherein the dummy sheets different in at least one of shape, size and arrangement pattern are arranged in accordance with an arrangement cycle specified in correspondence with an arrangement positions of constituent parts provided on the wiring layer.

3. The semiconductor device as claimed in claim 1, wherein there are provided a plurality of layers on which the dummy sheets are to be arranged and the dummy sheets on an upper layer are arranged in such a way that they overlap the dummy pattern of a lower layer at the same positions.

4. The semiconductor device as claimed in claim 1, wherein there are provided a plurality of layers on which the dummy sheets are to be arranged and the dummy sheets on an upper layer are arranged in such a way that they overlap the dummy pattern of a lower layer at the positions shifted in the direction perpendicular to the respective wirings.

5. The semiconductor device as claimed in claim 3, further comprising electric connection parts for electrically connecting the dummy sheets of the respective layers.

6. The semiconductor device as claimed in claim 4, further comprising electric connection parts for electrically connecting the dummy sheets of the respective layers.

7. A semiconductor device comprising:
    a wiring layer which is formed on a semiconductor substrate and in which a plurality of wirings are arranged in parallel;
    a first layer in which a plurality of dummy sheets are arranged on the wirings in the direction along the wiring;
    a second layer in which the dummy sheets are arranged in such a way that each of them spreads over two neighboring dummy sheets arranged on the first layer; and
    an electric connection part for electrically connecting the dummy sheet arranged on the first layer to the dummy sheet arranged on the second layer.

* * * * *